United States Patent
Lee et al.

(10) Patent No.: US 8,407,887 B2
(45) Date of Patent: Apr. 2, 2013

(54) PRESSING APPARATUS FOR PRESSING HEAT SINKS ON A CIRCUIT BOARD AND PRESSING TOOL THEREOF

(75) Inventors: Chia-Ming Lee, Taipei Hsien (TW); Shou-Yuan Yang, Taipei Hsien (TW)

(73) Assignee: Winstron Corporation, Taipei Hsien (TW)

( * ) Notice: Subject to any disclaimer, the term of this patent is extended or adjusted under 35 U.S.C. 154(b) by 470 days.

(21) Appl. No.: 12/702,903

(22) Filed: Feb. 9, 2010

(65) Prior Publication Data

US 2011/0088255 A1   Apr. 21, 2011

(30) Foreign Application Priority Data

Oct. 19, 2009 (TW) ................................ 98135246 A (51) Int. Cl.
*B23P 19/00* (2006.01)
(52) U.S. Cl. ............... 29/761; 29/760; 29/787; 29/790
(58) Field of Classification Search .................. 29/761, 29/743, 760, 787, 790; 228/6.2, 8, 9, 102, 228/235.1
See application file for complete search history.

(56) References Cited

U.S. PATENT DOCUMENTS

| 5,285,946 | A | * | 2/1994 | Tomigashi et al. | ............... | 228/9 |
| 6,616,031 | B2 | * | 9/2003 | Wong et al. | .................. | 228/102 |

FOREIGN PATENT DOCUMENTS

TW   461363   10/2001

OTHER PUBLICATIONS

Official Action issued on Jul. 18, 2012, for Taiwanese Counterpart Patent Application No. 098135246 and an abridged English translation thereof.

* cited by examiner

*Primary Examiner* — Thiem Phan (74) *Attorney, Agent, or Firm* — Brinks Hofer Gilson & Lione (57) ABSTRACT

A pressing apparatus is adapted for pressing a plurality of heat sinks on a circuit board, and includes a frame body and a plurality of pressing tools. The frame body includes a platform configured for placement of the circuit board thereon, and a mounting frame disposed above and spaced apart from the platform. The pressing tools are disposed at respective positions on the mounting frame. Each of the pressing tools includes an axle component, a universal joint unit disposed at a bottom end of the axle component, and a pressing head connected to the universal joint unit. The axle component extends downwardly between the platform and the mounting frame, and is configured to be resiliently and vertically movable. The pressing head is adapted for contacting one of the heat sinks, and is rotatable about the axle component by virtue of the universal joint unit.

16 Claims, 5 Drawing Sheets

FIG. 5

PRESSING APPARATUS FOR PRESSING HEAT SINKS ON A CIRCUIT BOARD AND PRESSING TOOL THEREOF

CROSS-REFERENCE TO RELATED APPLICATION

This application claims priority of Taiwanese Application No. 098135246, filed on Oct. 19, 2009.

BACKGROUND OF THE INVENTION

1. Field of the Invention

The present invention relates to a pressing apparatus for pressing heat sinks, more particularly to a pressing apparatus for pressing heat sinks with heat-dissipating fins on a circuit board.

2. Description of the Related Art

Generally, when it is desired for electronic components disposed on a circuit board to have relatively good cooling efficiency, heat sinks, with heat-dissipating fins for example, are joined to the electronic components. The heat sinks are usually joined to and mounted on the electronic components by using jigs for pressing. For example, the disclosures of U.S. Pat. No. 6,865,082 and U.S. Pat. No. 7,342,790 both employ jigs or pressing components for mounting the heat sinks on the electronic components.

However, when many places on the circuit board require disposition of the heat sinks or due to arrangement of components on the circuit board, there is a possible problem that there is insufficient for disposition of the jigs. In this situation, for example, the heat sinks are joined to the electronic components on the circuit board in a manner that the heat sinks require application of glue and subsequent pressing for attaching to the electronic components.

Moreover, when many places on the circuit board require disposition of the heat sinks, operation time will be prolonged if disposition of each of the heat sinks is conducted in turns.

SUMMARY OF THE INVENTION

Therefore, an object of the present invention is to provide a pressing apparatus capable of pressing a plurality of heat sinks on a circuit board at the same time.

Another object of the present invention is to provide a pressing tool adapted for use in the above-mentioned pressing apparatus.

A pressing apparatus according to the present invention is adapted for pressing a plurality of heat sinks on a circuit board. The pressing apparatus comprises a frame body and a plurality of pressing tools. The frame body includes a platform configured for placement of the circuit board thereon, and a mounting frame disposed above and spaced apart from the platform. The pressing tools are disposed at respective positions on the mounting frame. Each of the pressing tools includes a base component, an axle component, a universal joint unit, and a pressing head. The base component is disposed at the mounting frame. The axle component is disposed at the base component and extends downwardly between the platform and the mounting frame. The axle component is configured to be resiliently and vertically movable with respect to the base component. The axle component has a bottom end. The universal joint unit is disposed at the bottom end of the axle component. The pressing head is connected to the universal joint unit and is adapted for contacting one of the heat sinks. The pressing head is rotatable about the axle component by virtue of the universal joint unit.

A feature of the present invention is that the universal joint unit includes a first joint component disposed at the bottom end of the axle component, and a second joint component connected to the pressing head. Preferably, the first joint component is a ball, and the second joint component is a ball socket base formed with a ball socket for accommodating the ball.

Preferably, the ball socket base includes a pair of curved members, each of which includes two ends and a curved inner side formed with a curved slot. The curved members are joined together with the two ends of one of the curved members facing the two ends of the other one of the curved members to define the ball socket.

Preferably, each of the pressing tools further includes a compression spring disposed between and abutting against the axle component and the pressing head.

Preferably, the base component includes a tubular body and a secondary compression spring disposed in the tubular body, and the axle component further has a top end extending into the tubular body and abutting against the secondary compression spring.

Another feature of the present invention is that the pressing apparatus further comprises a driving unit. The driving unit includes a pressure cylinder, a fluid supply and a controller. The pressure cylinder includes a cylinder body disposed on the platform, and a driving shaft that is connected to and is movable to extend out of and retract into the cylinder body. The driving shaft has a top end connected to the mounting frame, and drives the mounting frame to move vertically with respect to the platform when the driving shaft moves relative to the cylinder body. The fluid supply is connected to the cylinder body, and is operable to drive movement of the driving shaft. The controller is coupled to the fluid supply, and is operable to control the fluid supply to actuate the pressure cylinder to extend or retract the driving shaft.

Yet another feature of the present invention is that the driving unit further includes a safety switch interconnecting the controller and the fluid supply. The safety switch is disposed on the platform in a manner that the controller is enabled to control the fluid supply to actuate the pressure cylinder when the circuit board disposed on the platform is placed against the safety switch, and is disabled from controlling the fluid supply when otherwise.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
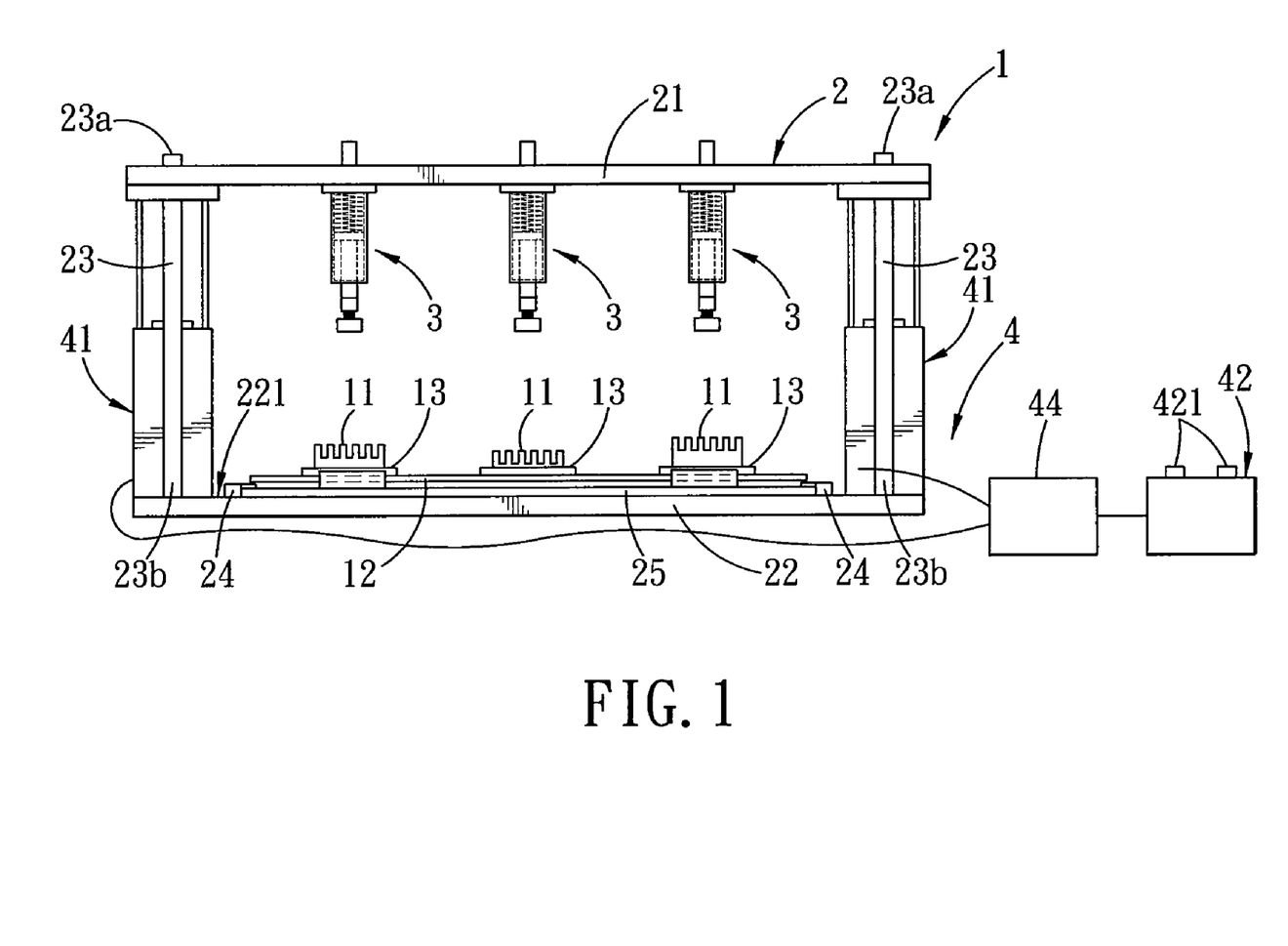
FIG. 1 is a front view of a preferred embodiment of a pressing apparatus for pressing heat sinks according to the present invention.
Figure 2:
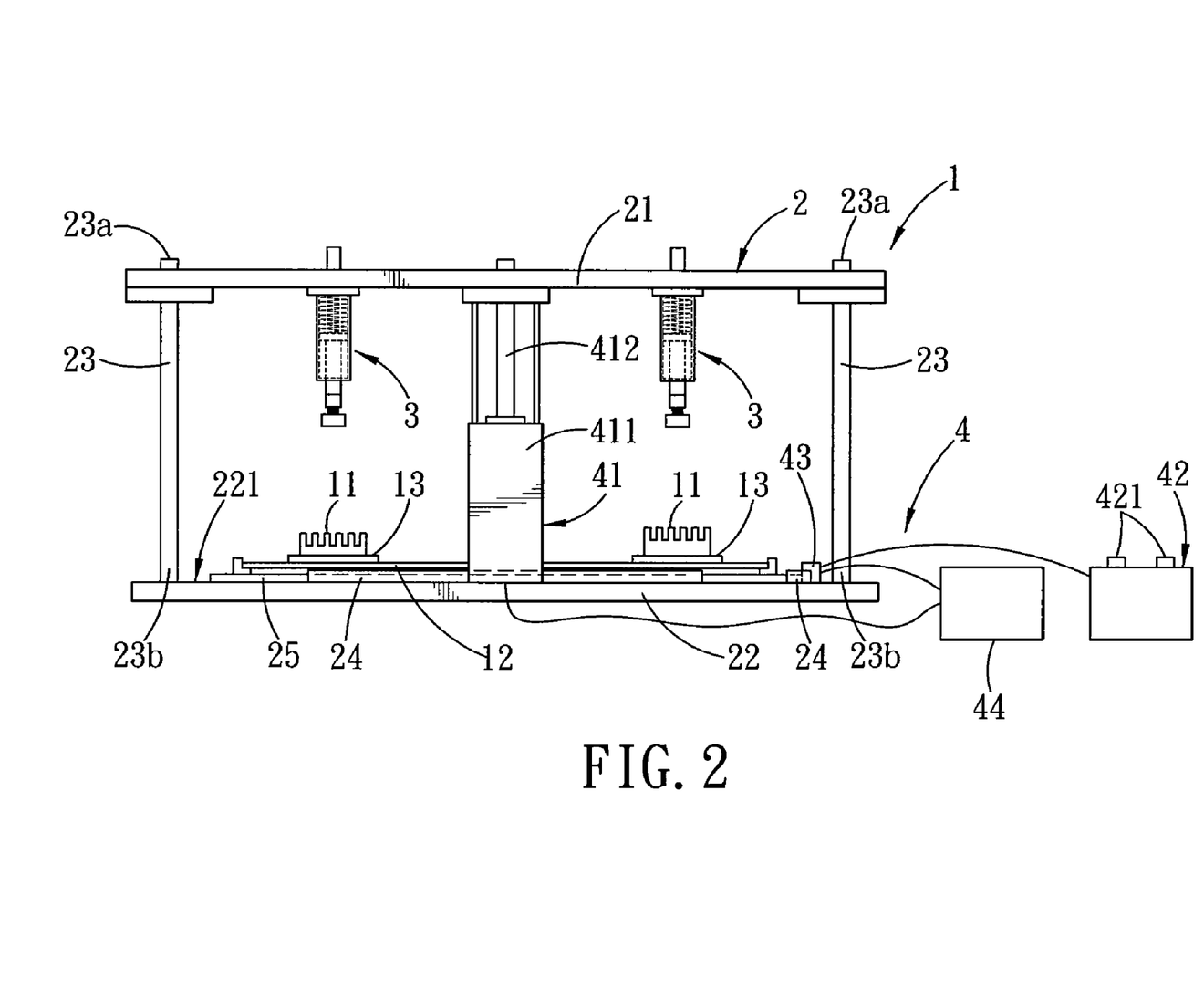
FIG. 2 is a side view of the preferred embodiment.

Referring to FIGS. 1 and 2, the preferred embodiment of a pressing apparatus 1 of the present invention is adapted for pressing a plurality of heat sinks 11 on a circuit board 12. Glue is applied to the heat sinks 11 in advance, and then the heat sinks 11 are placed on electronic components 13 of the circuit board 12. By pressure of the pressing apparatus 1, the heat sinks 11 are able to be attached to the electronic components 13. In this embodiment, the pressing apparatus 1 includes a frame body 2 and a plurality of pressing tools 3 disposed at the frame body 2.

The frame body 2 includes a mounting frame 21 and a platform 22. In this embodiment, the mounting frame 21 and the platform 22 are both in a shape of a board. The platform 22 is configured for placement of the circuit board 12 thereon. The mounting frame 21 is disposed above and spaced apart from the platform 22.

Referring to FIGS. 2 to 5, the pressing tools 3 are disposed at respective positions on the mounting frame 21 and between the mounting frame 21 and the platform 22. When the mounting frame 21 moves downwardly, the pressing tools 3 also move downwardly therewith. When the mounting frame 21 moves upwardly, the pressing tools 3 also move upwardly therewith.

Figure 3:
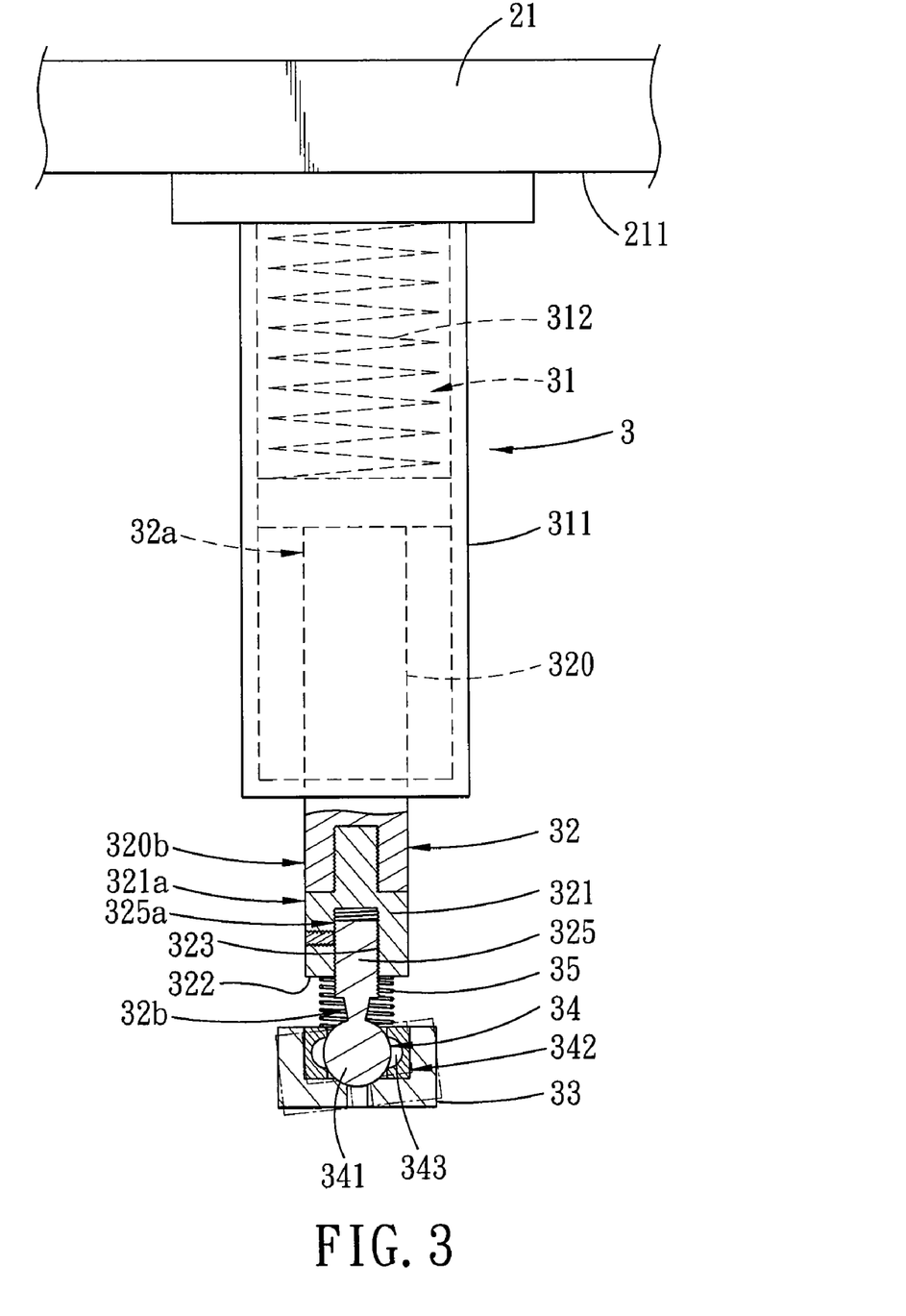
FIG. 3 is a side view of a pressing tool of the preferred embodiment with some components shown in cross-section.
Figure 4:
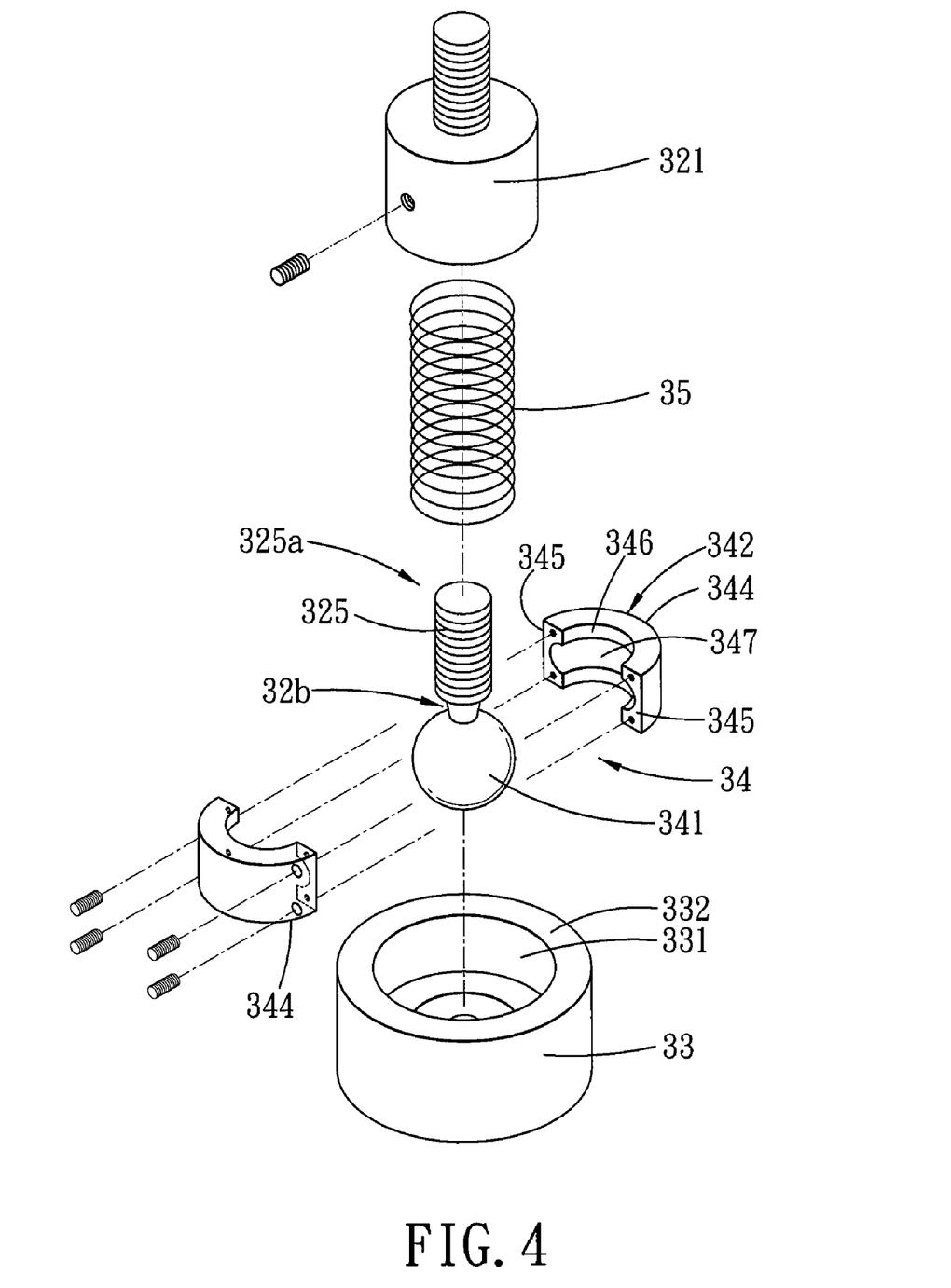
FIG. 4 is a fragmentary exploded perspective view of the pressing tool of the preferred embodiment.

Each of the pressing tools 3 includes a base component 31, an axle component 32, a pressing head 33, and a universal joint unit 34. The base component 31 is disposed at a bottom surface 211 of the mounting frame 21. The axle component 32 is disposed at the base component 31, and extends downwardly between the platform 22 and the mounting frame 21. The axle component 32 is configured to be resiliently and vertically movable with respect to the base component 31. The axle component 32 has a bottom end (32*b*), and the universal joint unit 34 is disposed at the bottom end (32*b*). The pressing head 33 is connected to the universal joint unit 34, and is adapted for contacting one of the heat sinks 11. The pressing head 33 is rotatable about the axle component 32 by virtue of the universal joint unit 34. Thus, due to the disposition of the universal joint unit 34, the pressing head 33 can be tilted to a corresponding angle in accordance with an outer surface of one of the heat sinks 11 which the pressing head 33 is in contact with. Therefore, there is a relatively large contact area between the pressing head 33 and the contacted one of the heat sinks 11, and a pressure exerted upon the contacted one of the heat sinks 11 by the pressing head 33 is relatively even.

The universal joint unit 34 includes a first joint component and a second joint component. The first joint component is disposed at the bottom end (32*b*) of the axle component 32, and the second joint component is connected to the pressing head 33. Moreover, the second joint component is rotatably joined to the first joint component. Preferably, the first joint component is a ball 341, and the second joint component is a ball socket base 342. In other words, the universal joint unit 34 is a ball-and-socket coupling mechanism. The ball 341 is disposed at the bottom end (32*b*) of the axle component 32, and the ball socket base 342 is joined to the pressing head 33 and is formed with a ball socket 343 for accommodating the ball 341.

The ball socket base 342 includes a pair of curved members 344. Each of the curved members 344 includes two ends 345, and a curved inner side 346 formed with a curved slot 347. The curved members 344 are joined together with the two ends 345 of one of the curved members 344 facing the two ends 345 of the other one of the curved members 344 to define the ball socket 343. Accordingly, it is relatively easier to assemble the ball socket base 342 consisting of two curved members 344 with the ball 341.

The pressing head 33 is in a form of a block, and has a top surface 332 formed with a cavity 331 in which the ball socket base 342 is embedded, such that the ball socket base 342 and the pressing head 33 can be joined to each other as a unit. The pressing head 33 can be made of plastic. In other embodiments, the ball socket base 342 and the pressing head 33 can be a unitary structure, i.e., the top surface 332 of the pressing head 33 can be directly formed with the ball socket 343.

Each of the pressing tools 3 further includes a compression spring 35. The compression spring 35 is disposed between and abuts against the axle component 32 and the pressing head 33. By virtue of a biasing force exerted upon the pressing head 33 by the compression spring 35, the pressing head 33 can be restored from the tilt angle to which the pressing head 33 has rotated due to the outer surface of the contacted one of the heat sinks 11.

The base component 31 includes a tubular body 311 and a secondary compression spring 312 disposed in the tubular body 311. The axle component 32 further has a top end (32*a*) extending into the tubular body 311 and abutting against the secondary compression spring 312. By virtue of the secondary compression spring 312, the axle component 32 is resiliently and vertically movable with respect to the tubular body 311.

Furthermore, the axle component 32 includes a first axle section 320, a second axle section 321, and a third axle section 325. The first axle section 320 has a top end serving as the top end (32*a*) of the axle component 32 that extends into the tubular body 311 and abuts against the secondary compression spring 312, and a bottom end (320*b*). The second axle section 321 has a top end (321*a*) connected to the bottom end (320*b*) of the first axle section 320, and a bottom surface 322 formed with a threaded hole 323. The third axle section 325 has a top end (325*a*) threadedly engaging the threaded hole 323 on the bottom surface 322 of the second axle section 321, and a bottom end serving as the bottom end (32*b*) of the axle component 32. The ball 341 (i.e., the first joint component) is disposed at the bottom end of the third axle section 325. In assembly, the first axle section 320 can be assembled with the tubular body 311 and the secondary compression spring 312 to form a unit, and the second axle section 321 and the third axle section 325 are assembled with the pressing head 33 through the universal joint unit 34 to form a modular unit. Moreover, the compression spring 35 is disposed around the third axle section 325, and is disposed between and abuts against the bottom surface 322 of the second axle section 321 and the ball socket base 342 (or the pressing head 33). Then, the two units are connected to each other by threaded engagement between the first axle section 320 and the second axle section 321.

The pressing apparatus 1 further includes a driving unit 4. The driving unit 4 includes a plurality of pressure cylinders 41, a fluid supply 44, and a controller 42. In this embodiment, the pressure cylinders 41 are pneumatic pressure cylinders, and the fluid supply 44 is operable to provide the pressure cylinders 41 with pressurized air. Certainly, the pressure cylinders 41 may be hydraulic pressure cylinders driven by pressurized oil from the fluid supply 44. Each of the pressure cylinders 41 includes a cylinder body 411 and a driving shaft 412. The cylinder body 411 is disposed on the platform 22, and the driving shaft 412 is connected to the cylinder body 411 and extends upwardly and is connected to the mounting frame 21. The driving shaft 412 is movable to extend out of and retract into the cylinder body 411. The controller 42 is coupled to the fluid supply 44, and includes a plurality of buttons 421 operable to output actuation signals for controlling the fluid supply 44 to actuate the pressure cylinders 41. When extending out of or retracting into the cylinder bodies 411, the driving shafts 412 of the pressure cylinders 41 drive the mounting frame 21 to move vertically with respect to the platform 22, thereby moving the pressing tools 3 vertically. By virtue of the driving unit 4, the pressing tools 3 can be moved automatedly.

The frame body 2 further includes a plurality of guiding pillars 23. Each of the guiding pillars 23 has a bottom end (23b) fixed to the platform 22 so as to be disposed in an upright state, and a top end (23a) extending upwardly and passing through the mounting frame 21 for guiding vertical movement of the mounting frame 21 with respect to the platform 22.

The frame body 2 further includes a plurality of stop blocks 24 disposed on a top surface 221 of the platform 22 and adjacent to left and right side edges and a rear edge of the platform 22. The stop blocks 24 are used for positioning the circuit board 12 when the circuit board 12 is placed on the top surface 221 of the platform 22.

Figure 5:
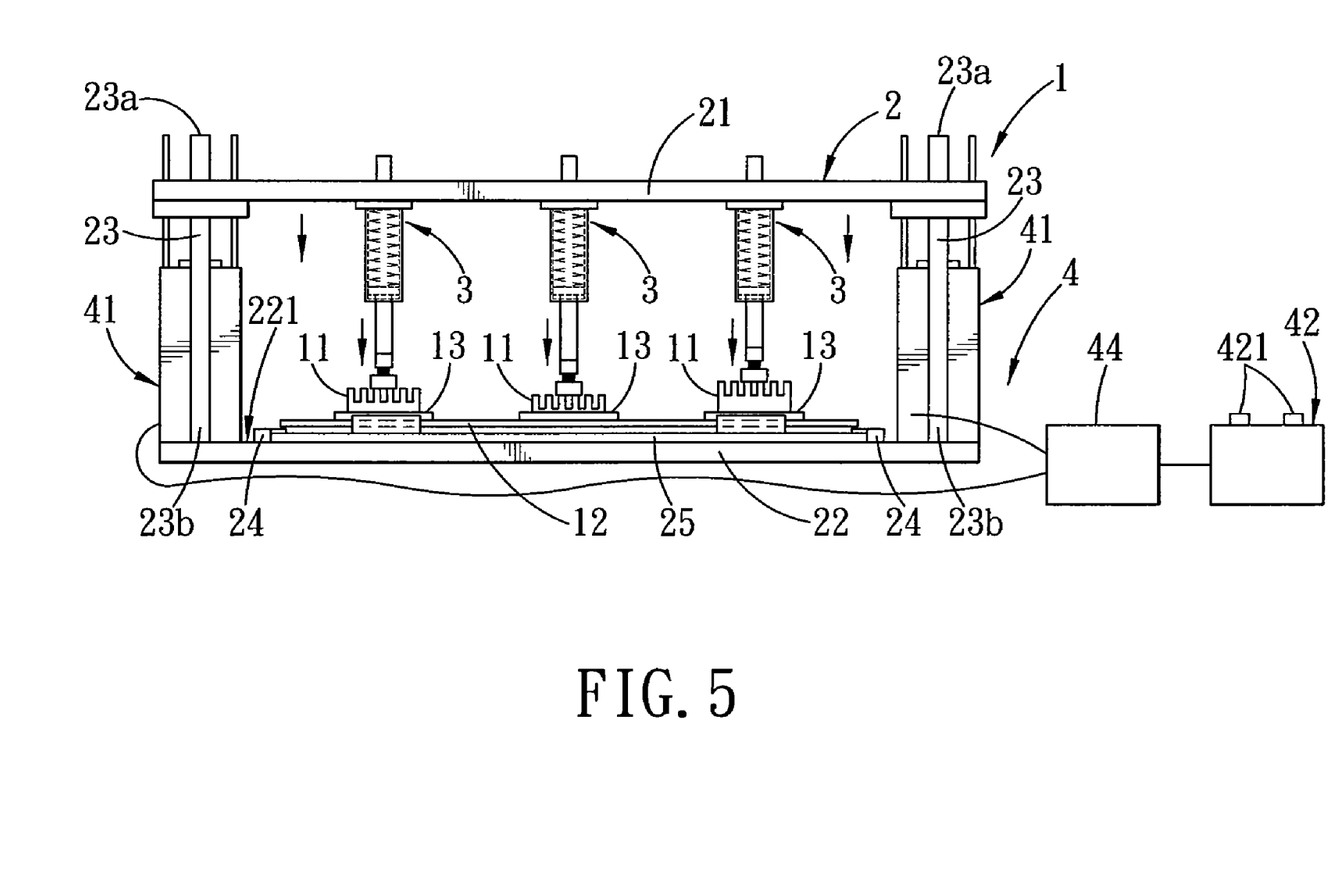
FIG. 5 is a schematic view showing a mounting frame of the preferred embodiment moved downwardly such that the pressing tools contact the heat sinks.

Therefore, when the pressing apparatus 1 is used to exert pressure upon the heat sinks 11 disposed on the circuit board 12, glue is applied to the heat sinks 11 before the heat sinks 11 are placed on the electronic components 13 on the circuit board 12. Then, the circuit board 12 is placed on the platform 22, and is positioned by abutting against the stop blocks 24. In this embodiment, the circuit board 12 is placed on a tray 25 first, and then the tray 25 is placed on the platform 22 in a manner that the tray 25 abuts against the stop blocks 24 for positioning the circuit board 12. Then, the mounting frame 21 and the pressing tools 3 are driven to move downwardly by operation of the buttons 421 of the controller 42 to actuate the fluid supply 44 to drive the pressure cylinders 41. By pressing the heat sinks 11 using the pressing heads 33 of the pressing tools 3, the heat sinks 11 can be attached to the circuit board 12.

In order to successfully perform the pressing operation without an error in positions where the pressing tools 3 press the heat sinks 11, the driving unit 4 further includes a safety switch 43. The safety switch 43 is disposed on the top surface 221 of the platform 22 and adjacent to the rear edge of the platform 22, and interconnects the controller 42 and the fluid supply 44. In practice, the safety switch 43 can be an electronic component, such as a limit switch. When the circuit board 12 (or the tray 25) disposed on the platform 22 is placed against the safety switch 43, the controller 42 is electrically connected to the fluid supply 44, and the fluid supply 44 is able to receive the actuation signals from the controller 42 to actuate operation of the pressure cylinder 41 while the buttons 421 of the controller 42 are pressed. When the circuit board 12 (or the tray 25) disposed on the platform 22 is not placed against the safety switch 43, i.e., the circuit board 12 is not placed in a proper position, the controller 42 is electrically disconnected from the fluid supply 44. At this time, the fluid supply 44 is disabled from receiving the actuation signals from the buttons 421 when the buttons 421 are pressed. That is to say, the fluid supply 44 is disabled from driving the pressure cylinders 41. Accordingly, an operator of the pressing apparatus 1 can become aware that there is an error in the position of the circuit board 12 so that appropriate adjustment may be conducted.

It should be noted that, since heights of the heat sinks 11 may be different, a distance which each of the pressing tools 3 needs to move downwardly may be different. Thus, the base component 31 of each of the pressing tools 3 is provided with the secondary compression spring 312. Moreover, each of the pressing tools 3 is provided with the secondary compression spring 312 with a particular spring constant corresponding to the height of the contacted one of the heat sinks 11. When the pressing head 33 contacts the contacted one of the heat sinks 11, the pressing head 33 exerts a particular pressing force upon the contacted one of the heat sinks 11 due to particular displacement of the secondary compression spring 312 that is related to the particular spring constant. Therefore, the heat sinks 11 with different heights can be pressed on the circuit board 12 at the same time without excessive or insufficient pressure.

In summary, by cooperation of the compression spring 35 and the universal joint unit 34, the pressing head 33 is able to automatically change the tilt angle in accordance with the outer surface of the contacted one of the heat sinks 11. Aside from achieving a relatively large contact area between the pressing head 33 and the contacted one of the heat sinks 11 and a relatively even pressure exerted upon the contacted one of the heat sinks 11, the pressing head 33 can be restored to a horizontal position via such a configuration. In addition, since each of the pressing tools 3 is provided with the secondary compression spring 312 with the particular spring constant, the pressing tools 3 are capable of pressing the heat sinks 11 with different heights in a single pressing stroke, respectively. Also, the heat sinks 11 with different heights are subjected to different amounts of pressing force, respectively. Operating time can be certainly shortened.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A pressing tool adapted for use in a pressing apparatus including a frame body, said pressing tool being disposed at the frame body and being movable to press a heat sink on a circuit board, said pressing tool comprising:
    a base component disposed at the frame body;
    an axle component disposed at said base component and configured to be resiliently movable with respect to said base component, said axle component having a bottom end;
    a universal joint unit disposed at said bottom end of said axle component; and
    a pressing head connected to said universal joint unit and adapted for contacting the heat sink, said pressing head being rotatable about said axle component by virtue of said universal joint unit,
    wherein said universal joint unit includes a first joint component disposed at said bottom end of said axle component, and a second joint component connected to said pressing head, and
    wherein said first joint component is a ball, and said second joint component is a ball socket base formed with a ball socket for accommodating said ball.

2. The pressing tool as claimed in claim 1, wherein said ball socket base includes a pair of curved members, each of which includes two ends and a curved inner side formed with a curved slot, said curved members being joined together with said two ends of one of said curved members facing said two ends of the other one of said curved members to define said ball socket.

3. The pressing tool as claimed in claim 2, wherein said pressing head has a top surface formed with a cavity in which said ball socket base is embedded.

4. The pressing tool as claimed in claim 1, further comprising a compression spring disposed between and abutting against said axle component and said pressing head.

5. The pressing tool as claimed in claim 4, wherein said base component includes a tubular body and a secondary compression spring disposed in said tubular body, and said axle component further has a top end extending into said tubular body and abutting against said secondary compression spring.

6. The pressing tool as claimed in claim 5, wherein said axle component includes:
- a first axle section having a top end serving as said top end of said axle component that extends into said tubular body and abuts against said secondary compression spring, and a bottom end;
- a second axle section connected to said bottom end of said first axle section, and having a bottom surface formed with a threaded hole; and
- a third axle section having a top end threadedly engaging said threaded hole of said second axle section, and a bottom end serving as said bottom end of said axle component;
- said universal joint unit being disposed at said bottom end of said third axle section, said compression spring being disposed between and abutting against said bottom surface of said second axle section and said pressing head.

7. A pressing apparatus adapted for pressing a plurality of heat sinks on a circuit board, said pressing apparatus comprising:
- a frame body including
  - a platform configured for placement of the circuit board thereon, and
  - a mounting frame disposed above and spaced apart from said platform; and
- a plurality of pressing tools being disposed at respective positions on said mounting frame, each of said pressing tools including
  - a base component disposed at said mounting frame,
  - an axle component disposed at said base component and extending downwardly between said platform and said mounting frame, said axle component being configured to be resiliently and vertically movable with respect to said base component, said axle component having a bottom end,
  - a universal joint unit disposed at said bottom end of said axle component, and
  - a pressing head connected to said universal joint unit and adapted for contacting one of the heat sinks, said pressing head being rotatable about said axle component by virtue of said universal joint unit,
  - wherein said universal joint unit includes a first joint component disposed at said bottom end of said axle component, and a second joint component connected to said pressing head, and
  - wherein said first joint component is a ball, and said second joint component is a ball socket base formed with a ball socket for accommodating said ball.

8. The pressing apparatus as claimed in claim 7, wherein said ball socket base includes a pair of curved members, each of which includes two ends and a curved inner side formed with a curved slot, said curved members being joined together with said two ends of one of said curved members facing said two ends of the other one of said curved members to define said ball socket.

9. The pressing apparatus as claimed in claim 8, wherein said pressing head has a top surface formed with a cavity in which said ball socket base is embedded.

10. The pressing apparatus as claimed in claim 7, wherein each of said pressing tools further includes a compression spring disposed between and abutting against said axle component and said pressing head.

11. The pressing apparatus as claimed in claim 10, wherein said base component includes a tubular body and a secondary compression spring disposed in said tubular body, and said axle component further has a top end extending into said tubular body and abutting against said secondary compression spring.

12. The pressing apparatus as claimed in claim 11, wherein said axle component includes:
- a first axle section having a top end serving as said top end of said axle component that extends into said tubular body and abuts against said secondary compression spring, and a bottom end;
- a second axle section connected to said bottom end of said first axle section, and having a bottom surface formed with a threaded hole; and
- a third axle section having a top end threadedly engaging said threaded hole of said second axle section, and a bottom end serving as said bottom end of said axle component;
- said universal joint unit being disposed at said bottom end of said third axle section, said compression spring being disposed between and abutting against said bottom surface of said second axle section and said pressing head.

13. The pressing apparatus as claimed in claim 7, further comprising a driving unit including:
- a pressure cylinder including a cylinder body disposed on said platform, and a driving shaft that is connected to and is movable to extend out of and retract into said cylinder body, said driving shaft having a top end connected to said mounting frame, said driving shaft driving said mounting frame to move vertically with respect to said platform when said driving shaft moves relative to said cylinder body;
- a fluid supply connected to said cylinder body and operable to drive movement of said driving shaft; and
- a controller coupled to said fluid supply and operable to control said fluid supply to actuate said pressure cylinder to extend or retract said driving shaft.

14. The pressing apparatus as claimed in claim 13, wherein said driving unit further includes a safety switch interconnecting said controller and said fluid supply, said safety switch being disposed on said platform in a manner that said controller is enabled to control said fluid supply to actuate said pressure cylinder when the circuit board disposed on said platform is placed against said safety switch, and is disabled from controlling said fluid supply when otherwise.

15. The pressing apparatus as claimed in claim 13, wherein said frame body further includes a plurality of guiding pillars, each of which has a bottom end fixed to said platform, and a top end passing through said mounting frame for guiding vertical movement of said mounting frame.

16. The pressing apparatus as claimed in claim 7, wherein said frame body further includes a plurality of stop blocks disposed on said platform for positioning the circuit board.

* * * * *

UNITED STATES PATENT AND TRADEMARK OFFICE
CERTIFICATE OF CORRECTION

| | | |
|---|---|---|
| PATENT NO. | : 8,407,887 B2 | Page 1 of 1 |
| APPLICATION NO. | : 12/702903 | |
| DATED | : April 2, 2013 | |
| INVENTOR(S) | : Chia-Ming Lee et al. | |

It is certified that error appears in the above-identified patent and that said Letters Patent is hereby corrected as shown below:

<u>On the Title Page</u>

Left column, item (73), replace "Winstron Corporation" with --Wistron Corporation--.

Signed and Sealed this
Thirteenth Day of August, 2013

Teresa Stanek Rea
*Acting Director of the United States Patent and Trademark Office*